(12) United States Patent
Suzuki et al.

(10) Patent No.: US 8,466,529 B2
(45) Date of Patent: Jun. 18, 2013

(54) IMAGING DEVICE, IMAGING MODULE AND METHOD FOR MANUFACTURING IMAGING DEVICE

(75) Inventors: Kazuhiro Suzuki, Tokyo (JP); Risako Ueno, Tokyo (JP); Honam Kwon, Kanagawa-ken (JP); Koichi Ishii, Kanagawa-ken (JP); Hideyuki Funaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 131 days.

(21) Appl. No.: 13/051,413

(22) Filed: Mar. 18, 2011

(65) Prior Publication Data
US 2012/0056291 A1    Mar. 8, 2012

(30) Foreign Application Priority Data

Sep. 8, 2010    (JP) .................................. 2010-201006

(51) Int. Cl.
*H01L 31/0232*    (2006.01)
(52) U.S. Cl.
USPC ............................ 257/432; 257/431; 257/466
(58) Field of Classification Search
USPC .................. 257/431, 432, 457, 459, 466, 622
See application file for complete search history.

(56) References Cited

U.S. PATENT DOCUMENTS

| 7,015,560 | B2 * | 3/2006 | Kim et al. | 257/457 |
| 7,528,420 | B2 * | 5/2009 | Weng et al. | 257/98 |
| 7,566,944 | B2 * | 7/2009 | Wang et al. | 257/459 |
| 2011/0278690 | A1 * | 11/2011 | Bui et al. | 257/432 |
| 2012/0313204 | A1 * | 12/2012 | Haddad et al. | 257/432 |
| 2012/0313205 | A1 * | 12/2012 | Haddad et al. | 257/432 |
| 2012/0326257 | A1 * | 12/2012 | Takata | 257/432 |

FOREIGN PATENT DOCUMENTS

| JP | 2002-512436 A | 4/2002 |
| JP | 2003-156390 A | 5/2003 |
| JP | 2005-236159 | 9/2005 |
| JP | 2008-39684 A | 2/2008 |
| JP | 2009-76811 A | 4/2009 |
| JP | 2009-244282 A | 10/2009 |
| JP | 2010-114199 A | 5/2010 |
| JP | 2010-147230 A | 7/2010 |

OTHER PUBLICATIONS

Office Action issued Aug. 15, 2012 in Japanese Patent Application No. 2010-201006 (with English-language translation).
Office Action issued Jan. 25, 2013 in Japanese Patent Application No. 2010-201006 with English language translation.

* cited by examiner

*Primary Examiner* — Sheila V Clark
(74) *Attorney, Agent, or Firm* — Oblon, Spivak, McClelland, Maier & Neustadt, L.L.P.

(57) ABSTRACT

According to one embodiment, an imaging device includes a substrate, a photodetecting portion, a circuit portion and a through interconnect. The substrate has a first major surface, a second major surface on a side opposite to the first major surface, a recess portion provided on the first major surface and retreated in a first direction going from the first major surface to the second major surface, and a through hole communicating with the first major surface and the second major surface and extending in the first direction. The photodetecting portion is provided above the recess portion and away from the substrate. The circuit portion is electrically connected to the photodetecting portion and provided on the first major surface. The through interconnect is electrically connected to the circuit portion and provided inside the through hole. The recess portion has a first inclined surface. The through hole has a second inclined surface.

16 Claims, 9 Drawing Sheets

US 8,466,529 B2

IMAGING DEVICE, IMAGING MODULE AND METHOD FOR MANUFACTURING IMAGING DEVICE

CROSS-REFERENCE TO RELATED APPLICATIONS

This application is based upon and claims the benefit of priority from the prior Japanese Patent Application No. 2010-201006, filed on Sep. 8, 2010; the entire contents of which are incorporated herein by reference.

FIELD

Embodiments described herein relate generally to an imaging device, an imaging module and a method for manufacturing the imaging device.

BACKGROUND

An imaging device is a device that converts light entering from the outside to an electric signal. Among the imaging devices, in an infrared sensor that collects infrared rays and converts radiation energy to an electric signal, a structure is adopted in which photoelectric conversion portion is arranged away from peripheral members such as a lid, a substrate and the like that absorb the infrared rays. In order to separate the photoelectric conversion portion away from the peripheral members so that the members are not subjected to the external heat, a structure can be conceived in which a space is provided around the photoelectric conversion portion and the inside of the space is vacuumed. In such an imaging device, further improvement of productivity is in demand.

DETAILED DESCRIPTION

Figure 1:
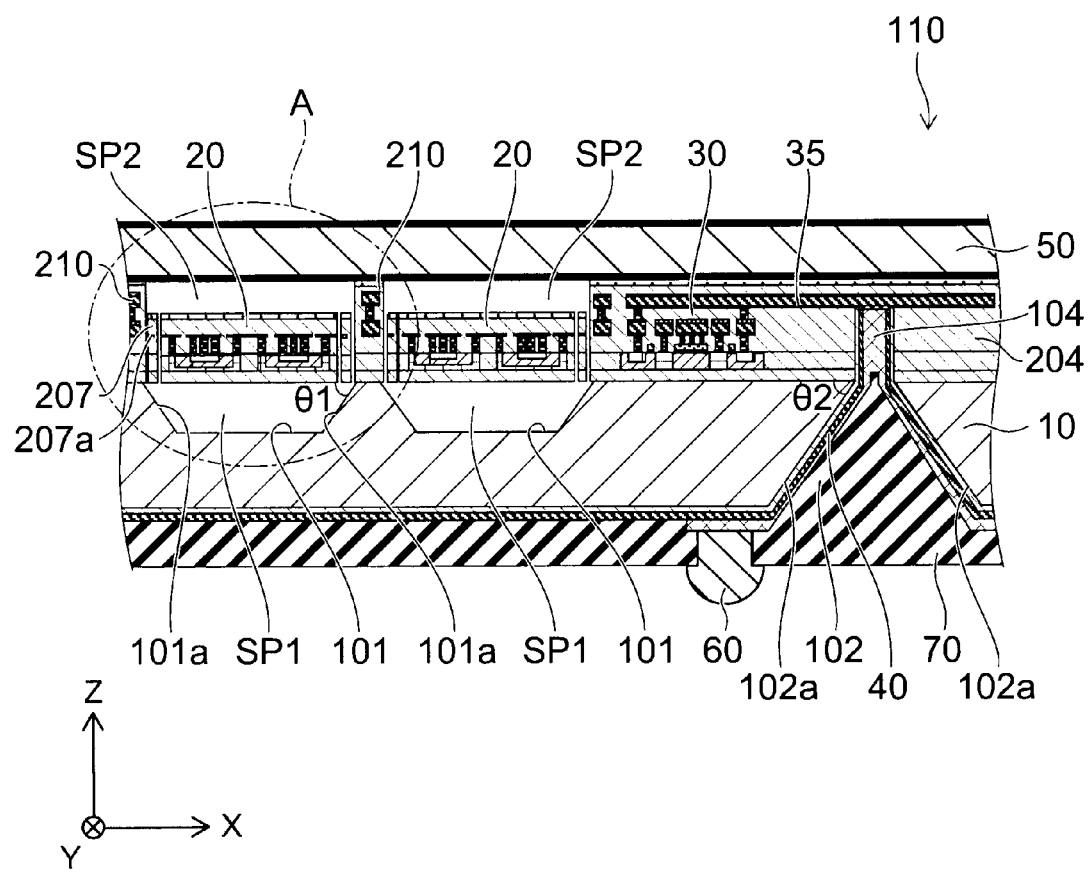
FIG. 1 is a schematic sectional view illustrating an imaging device according to a first embodiment.

In general, according to one embodiment, an imaging device includes a substrate, a photodetecting portion, a circuit portion and a through interconnect. The substrate has a first major surface, a second major surface on a side opposite to the first major surface, a recess portion provided on the first major surface and retreated in a first direction going from the first major surface to the second major surface, and a through hole communicating with the first major surface and the second major surface and extending in the first direction. The photodetecting portion is provided above the recess portion and away from the substrate. The circuit portion is electrically connected to the photodetecting portion and provided on the first major surface. The through interconnect is electrically connected to the circuit portion and provided inside the through hole. The recess portion has a first inclined surface inclined to the first major surface, and the through hole has a second inclined surface in parallel with the first inclined surface.

In general, according to one other embodiment, an imaging module includes an imaging device, and a lens. The imaging device includes a substrate, a photodetecting portion, a circuit portion, a through interconnect and a lid. The substrate has a first major surface, a second major surface on a side opposite to the first major surface, a recess portion provided on the first major surface and retreated in a first direction going from the first major surface to the second major surface, and a through hole communicating with the first major surface and the second major surface and extending in the first direction. The photodetecting portion is provided above the recess portion and away from the substrate. The circuit portion is electrically connected to the photodetecting portion and provided on the first major surface. The through interconnect is electrically connected to the circuit portion and provided inside the through hole. The lid is provided above a side opposite to the substrate of the photodetecting portion and away from the photodetecting portion. The recess portion has a first inclined surface inclined to the first major surface, and the through hole has a second inclined surface in parallel with the first inclined surface. The lens is provided on the lid of the imaging device.

In general, according to one other embodiment, a manufacturing method of an imaging device is disclosed. The method can include forming a photodetecting portion on a first major surface of a substrate and a circuit portion electrically connected to the photodetecting portion. The method can include etching for forming at least a part of a through hole penetrating the substrate along a direction orthogonal to the first major surface while forming a recess portion in the substrate between the substrate and the photodetecting portion. IN addition, the method can include forming a through interconnect electrically connected to the circuit portion inside the through hole.

Various embodiments will be described hereinafter with reference to the accompanying drawings.

The drawings are schematic or conceptual and a relationship between the thickness and the width of each portion, the coefficient of ratio in size of portions and the like are not necessarily the same as actual ones. Also, even if the same portions are indicated, dimensions and coefficient ratios might be expressed differently depending on the drawings.

Also, in the description and each figure, the same elements as those already described in relation with the described figures are given the same reference numerals, and detailed description will be omitted as appropriate.

First Embodiment

A first embodiment is an example of an imaging device.

FIG. 1 is a schematic sectional view illustrating the configuration of an imaging device according to the first embodiment.

Figure 2:
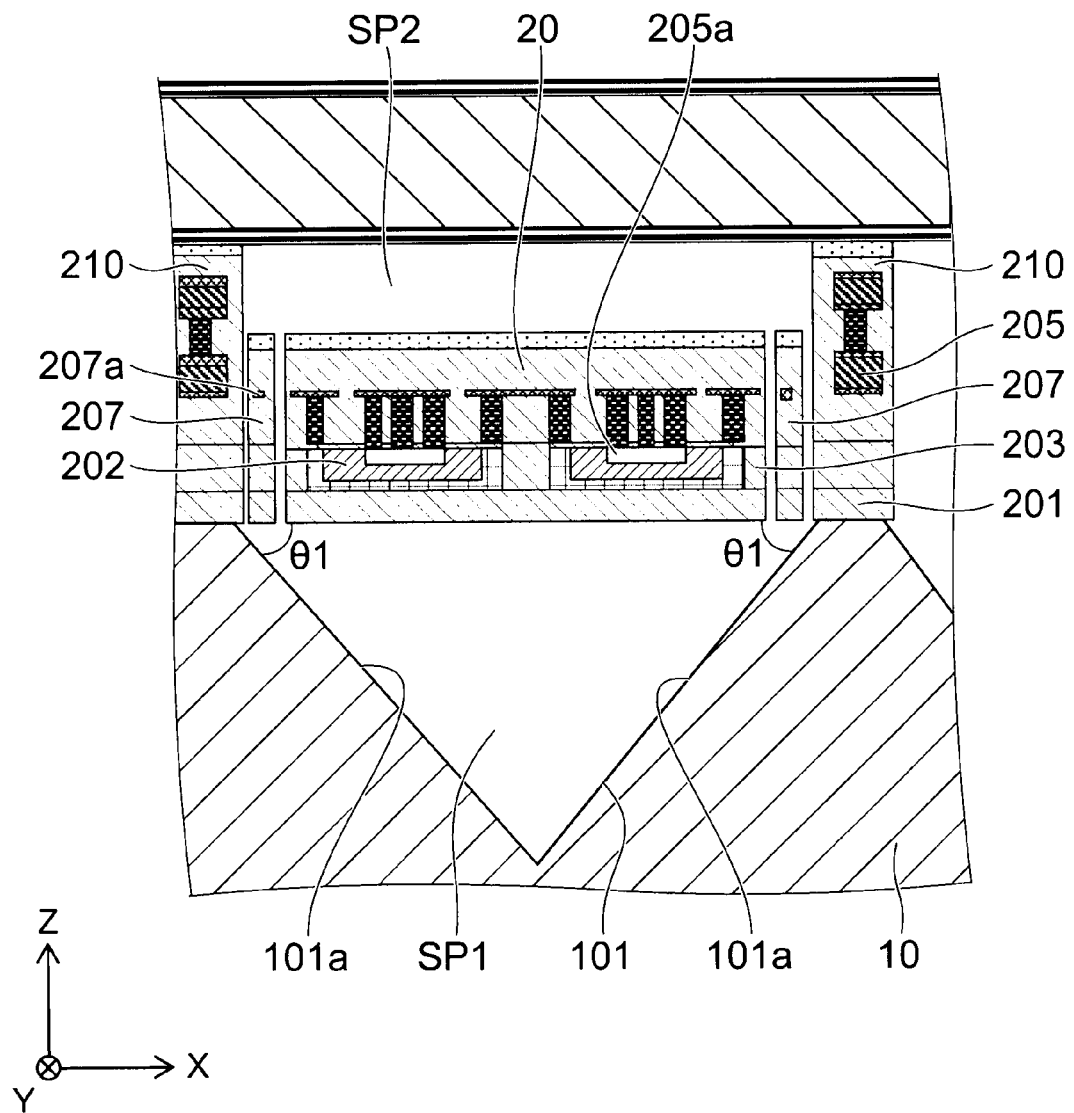
FIG. 2 is a schematic sectional view of a part of the imaging device in an enlarged manner.

FIG. 2 is a schematic sectional view of an A part in FIG. 1 in an enlarged manner.

Figure 3:
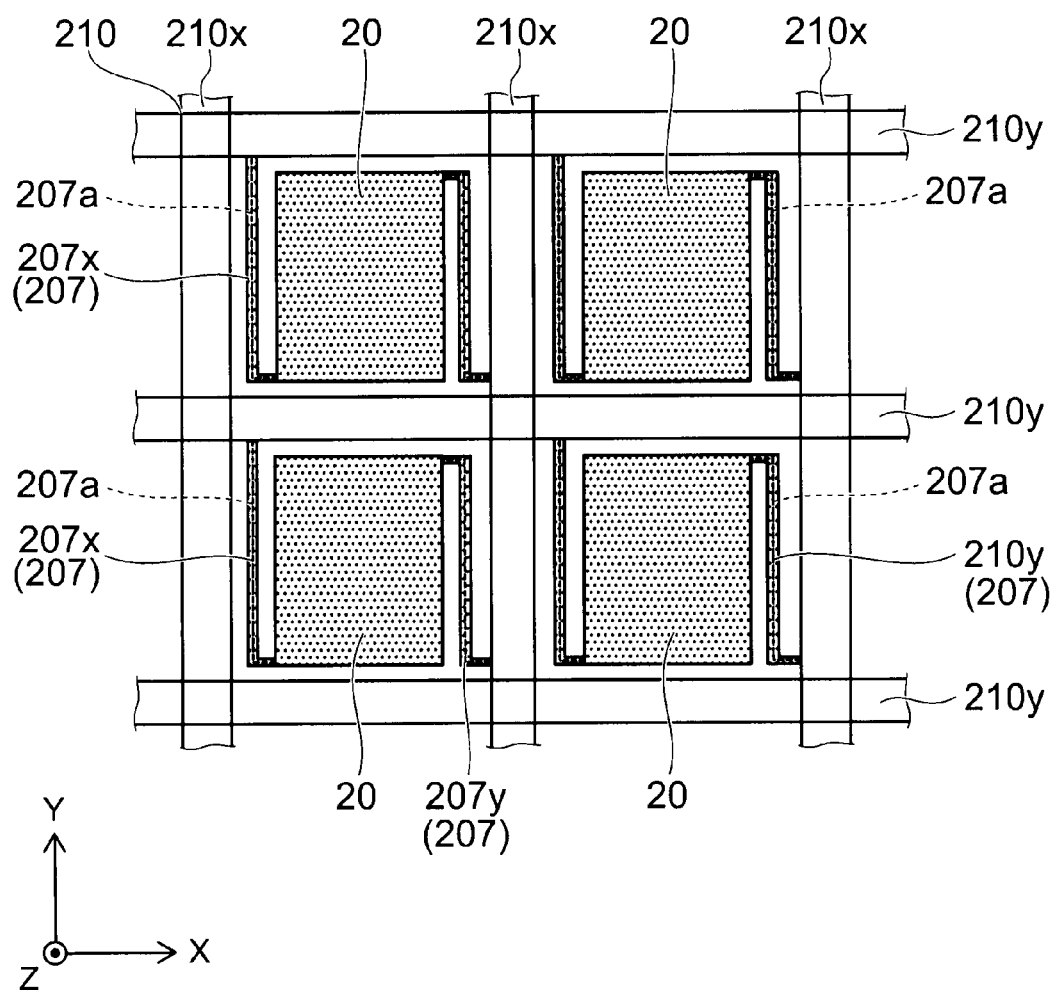
FIG. 3 is a schematic plan view illustrating a photodetecting portion.

FIG. 3 is a schematic plan view illustrating a photodetecting portion.

An imaging device 110 according to the first embodiment is provided with a substrate 10, a photodetecting portion 20, a circuit portion 30, and a through interconnect 40.

The substrate 10 has a recess portion 101 and a through hole 102.

The substrate 10 has a first major surface 10a and a second major surface 10b on the side opposite to the first major surface 10a of the substrate 10.

Here, for convenience of explanation, it is assumed that a direction of an axis going from the second major surface 10b to the first major surface 10a is the Z-axis direction, one of directions orthogonal to the Z-axis direction is the X-axis direction, and a direction orthogonal to the Z-axis direction and the X-axis direction is the Y-axis direction. Also, it is assumed that the side of the first major surface 10a of the substrate 10 is an upper side or a front face side, and the side of the second major surface 10b of the substrate 10 is a lower side or a back face side.

The recess portion 101 is provided in the first major surface 10a of the substrate 10. The recess portion 101 is provided in a shape of a recess retreated from the first major surface 10a along the Z-axis direction.

As illustrated in FIG. 2, the sectional shape of the recess portion 101 is a triangle (inverted triangle) having an extended line of the first major surface 10a as the base. That is, the width in the direction along the first major surface 10a of an opening of the recess portion 101 gets smaller as it goes from the first major surface 10a to the second major surface 10b.

The recess portion 101 includes a first inclined surface 101a inclined with a first angle θ1 with respect to the first major surface 10a.

In FIG. 1, the sectional shape of the recess portion 101 is illustrated in the shape of a trapezoid due to the reduction scale. However, depending on the degree of progress of etching of the substrate 10, which will be described later, the sectional shape of the recess portion 101 may become those other than a triangle.

The through hole 102 penetrates the substrate 10 in the Z-axis direction. That is, the through hole 102 communicates with the first major surface 10a and the second major surface 10b and extends in the Z-axis direction. The width in the direction along the second major surface 10b of the opening of the through hole 102 gets smaller as it goes from the second major surface 10b to the first major surface 10a. The through hole 102 includes a second inclined surface 102a, which is an inner wall surface.

The second inclined surface 102a of the through hole 102 is in parallel with the first inclined surface 101a of the recess portion 101. That is, a second angle θ2 of the second inclined surface 102a to the first major surface 10a is equal to the first angle θ1.

The maximum opening size of the through hole 102 is larger than the maximum opening size of the recess portion 101.

The photodetecting portion 20 is provided above the recess portion 101 and away from the substrate 10. As a result, inside the recess portion 101 on the lower side of the photodetecting portion 20, a first space portion SP1 is provided.

The photodetecting portion 20 has a function of converting detected light to an electric signal in accordance with a light amount. The photodetecting portion 20 converts infrared rays to an electric signal, for example.

The circuit portion 30 is provided on the first major surface 10a. The circuit portion 30 is electrically connected to the photodetecting portion 20. The circuit portion 30 is electrically connected to the photodetecting portion 20 via an interconnect 207a provided in a support leg 207, which will be described later, for example. The circuit portion 30 may be formed of the same layer and the same material as those of the photodetecting portion 20 or may be formed of a different layer and a different material. The circuit portion 30 includes at least one of an active device such as a transistor and a passive device such as a resistor and an interconnect (conductor interconnect). The circuit portion 30 has at least one of functions of supplying a voltage to the photodetecting portion 20, of selecting one of a plurality of photodetecting portions 20, of processing an electric signal outputted from the photodetecting portion 20 and the like.

The through interconnect 40 is electrically connected to the circuit portion 30 and is provided inside the through hole 102.

The through interconnect 40 is electrically connected to an inter-layer interconnect portion 35 provided along an interconnect layer of the circuit portion 30, for example. The inter-layer interconnect portion 35 is arranged above the through hole 102 along the interconnect layer of the circuit portion 30. Between the through hole 102 and the inter-layer interconnect portion 35, a communication hole 104 is provided. A part of the inter-layer interconnect portion 35 is exposed by the communication hole 104. The through interconnect 40 is connected to the inter-layer interconnect portion 35 in the portion where the inter-layer interconnect portion 35 is exposed.

The through interconnect 40 is laid from a portion connected to the inter-layer interconnect portion 35 toward the second major surface 10b along an inner wall of the communication hole 104 and an inner wall of the through hole 102, for example.

In the imaging device 110 according to the embodiment, the first inclined surface 101a of the recess portion 101 includes a surface exposed by anisotropic etching of the substrate 10. Similarly, the second inclined surface 102a of the through hole 102 also includes a surface exposed by the anisotropic etching of the substrate 10.

If the substrate 10 contains silicon, for example, the first major surface 10a is a {100} surface of silicon (single crystal silicon). That is, the first major surface 10a is one of a (100) surface, a (010) surface, and a (001) surface.

The first inclined surface 101a and the second inclined surface 102a become {111} surfaces in a plane direction exposed by the anisotropic etching of silicon. As a result, the first angle θ1 and the second angle θ2 become approximately 55° (55°, 54.7°, and 54.74°, for example). Depending on the etching condition of the substrate 10, a part of the first inclined surface 101a and the second inclined surface 102a might include a surface other than the plane direction {111}.

The imaging device 110 is further provided with a lid 50. The lid 50 is provided away from the photodetecting portion 20 and above the upper side of the substrate 10. The lid 50 is mounted on the circuit portion 30. The circuit portion 30 may include a projecting portion 210. The projecting portion 210 is provided between the plurality of photodetecting portions 20 and projects upward from the substrate 10. The thickness of the circuit portion 30 in the Z-axis direction is larger than the thickness of the photodetecting portion 20 in the Z-axis direction. When the lid 50 is mounted on the circuit portion 30, a second space portion SP2 is provided between the lid 50 and the photodetecting portion 20.

In the imaging device 110 illustrated in FIG. 1, the photodetecting portion 20 is arranged between the first space portion SP1 on the lower side and the second space portion SP2 on the upper side. The pressure inside the first space portion SP1 and the pressure inside the second space portion SP2 are lower than an atmospheric pressure, for example.

The imaging device 110 is further provided with a bump electrode 60 provided on the back face side of the substrate 10. The bump electrode 60 projects in a direction away from the second major surface 10b. That is, the bump electrode 60 projects downward on the back face of the substrate 10. The bump electrode 60 is electrically connected to the through interconnect 40. In the imaging device 110 illustrated in FIG. 1, a back-face interconnect 41 electrically connected to the through interconnect 40 is provided on the back face side of the substrate 10. The bump electrode 60 is connected to the back-face interconnect 41, for example.

On the back face side of the substrate 10, a protective film 70 that covers a portion other than the bump electrode 60 is provided. The protective film 70 is a solder resist, for example.

Subsequently, a specific example of the imaging device 110 will be described.

For the imaging device 110, an SOI (Silicon On Insulator) substrate is used, for example. Also, for the substrate 10, a silicon substrate is used, for example. As illustrated in FIG. 2, on the first major surface 10a of the substrate 10, an embedded oxidized film 201 is provided, for example. On the embedded oxidized film 201, a semiconductor layer 202 is provided. The semiconductor layer 202 is separated by a device isolation insulating film 203 by STI (Shallow Trench Isolation), for example. The device isolation insulating film 203 divides the semiconductor layer 202 into a plurality of regions in the X-Y plane. On the semiconductor layer 202, a photoelectric conversion portion 202a by a pn-junction diode, for example, is provided.

On the device isolation insulating film 203, an inter-layer insulating film 204 is provided. The inter-layer insulating film 204 is a multi-layer film made of silicon oxide, for example. In the periphery of the photodetecting portion 20, a portion where the thickness in the Z-axis direction of the inter-layer insulating film 204 is larger than that of the photodetecting portion 20 becomes the projecting portion 210.

Between the multi-layer films of the inter-layer insulating film 204, an interconnect layer 205 is provided. In the interconnect layer 205, a wire 205a is embedded. The wire 205a is connected to an anode and a cathode of a PN-junction diode, for example, which is the photoelectric conversion portion 202a. The wire layer 205 is also provided on the projecting portion 210 and the support leg 207, which will be described later.

Between the photodetecting portion 20 and the projecting portion 210, the support leg 207 is provided. The support leg 207 extends in the X-Y plane, for example. The support leg 207 supports the photodetecting portion 20 between the first space portion SP1 and the second space portion SP2.

In FIG. 3, a state in which the photodetecting portion 20 is supported by the support leg 207 is illustrated. The plurality of photodetecting portions 20 are arranged in the matrix state along the X-Y plane. Between the plurality of photodetecting portions 20, the projecting portion 210 is provided. The projecting portion 210 has a portion 210x along the X-axis direction and a portion 210y along the Y-axis direction. The projecting portion 210 is provided in the lattice state by a plurality of the portions 210x and a plurality of the portions 210y.

One photodetecting portion 20 is arranged among the lattice of the projection portion 210. The photodetecting portion 20 is supported by the support leg 207 between the portion 210x and the portion 210y. The support leg 207 has a first support leg 207x provided between the photodetecting portion 20 and the portion 210x and a second support leg 207y provided between the photodetecting portion 20 and the portion 210y. The support leg 207 is a collective name of the first support leg 207x and the second support leg 207y. The support leg 207 illustrated in FIG. 3 is an example. The support leg 207 may be provided along the Y-axis direction by being folded several times, for example.

The support leg 207 is provided in a desired shape by etching the inter-layer insulating film 204, the device isolation insulating film 203, and the embedded oxidized film 201 around the photodetecting portion 20. By increasing the length of one end connected to the photodetecting portion 20 and the length of the other end connected to the projecting portion 210 of the support leg 207, insulation between the projecting portion 210 and the photodetecting portion 20 can be improved. Inside the support leg 207, the wire 207a is provided along the shape of the support leg 207. The photodetecting portion 20 and the circuit portion 30 are electrically connected to each other via the wire 207a.

For the lid 50, a material that sufficiently transmits light detected by the photodetecting portion 20 (infrared rays, for example) is used. For the lid 50, silicon is used, for example. The lid 50 is connected to the circuit portion 30. The lid 50 is connected to the circuit portion 30 through a bonding process at a normal temperature, for example.

By connecting the lid 50 to the circuit portion 30, the second space portion SP2 on the upper side of the photodetecting portion 20 is constituted. The second space portion SP2 and the first space portion SP1 on the lower side of the photodetecting portion 20 communicate with each other. If the lid 50 is connected to the projecting portion 210 and the circuit portion 30, the first space portion SP1 and the second space portion SP2 are sealed. As a result, by connecting the lid 50 under a pressure different from the atmospheric pressure, for example, internal pressures of the first space portion SP1 and the second space portion SP2 can be made the applicable pressures. In the imaging device 110, the internal pressures of the first space portion SP1 and the second space portion SP2 are in a state lower than the atmospheric pressure (a vacuum state, for example).

According to the above imaging device 110, the photodetecting portion 20 is installed in the space (between the first space portion SP1 and the second space portion SP2). Thus, the photodetecting portion 20 can be thermally isolated from the outside, and thermal conductance can be lowered. As a result, thermal insulation of the photodetecting portion 20 is improved, and a light amount can be accurately detected without forcedly cooling the imaging device 110.

Also, since the connection of the lid 50 is performed at a normal temperature, a large thermal stress is not applied to the photodetecting portion 20 during bonding of the lid 50.

If the lid 50 is bonded by soldering, for example, a process involving a temperature rise of several hundred degrees is required for melting of solder. Such a process at a high temperature applies a large thermal stress to the photodetecting portion 20.

In the embodiment, such a process at a high temperature is no longer needed, application of a thermal stress to the photodetecting portion 20 is avoided, and reliability can be maintained.

Also, in the imaging device 110 according to the embodiment, the recess portion 101 and the through hole 102 are formed by anisotropic etching of the substrate 10. Also, the connection of the lid 50 ensures sealing performance of the first space portion SP1 and the second space portion SP2. Therefore, formation of the photodetecting portion 20, formation of the recess portion 101 and the through hole 102, connection of the lid 50, and formation of the bump electrode 60 can be all performed without cutting the substrate 10. As a result, productivity of the imaging device 110 can be improved.

Second Embodiment

A second embodiment is an example of a method of manufacturing the imaging device.

FIG. 4A to FIG. 7 are schematic sectional views illustrating the manufacturing method of the imaging device.

Figure 4A:
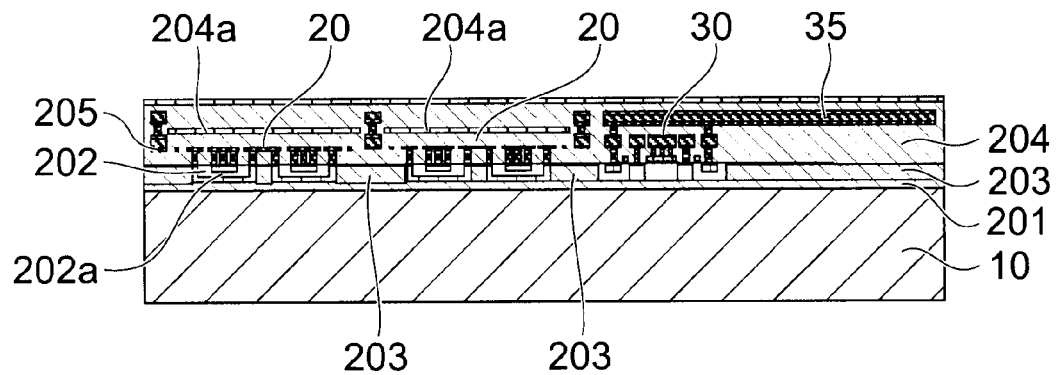
FIG. 4A to FIG. 7C are schematic sectional views illustrating a manufacturing method of a second embodiment.

First, as illustrated in FIG. 4A, the photodetecting portion 20 and the circuit portion 30 are formed on the substrate 10. Here, a CMOS (Complementary Metal Oxide Semiconductor) manufacturing process using an SOI substrate is applied, for example.

Specifically, the embedded oxidized film 201 is formed on the substrate 10 formed by single crystal silicon, and the semiconductor layer 202 is formed on the embedded oxidized film 201, for example. The semiconductor layer 202 is a single crystal silicon film, for example. The SOI substrate includes the silicon substrate 10, the embedded oxidized film 201, and the semiconductor layer 202.

In the semiconductor layer 202, the device isolation insulating film 203 is formed. Predetermined impurities are injected or the like into the semiconductor layer 202 between the device isolation insulating films 203 so as to form the photoelectric conversion portion 202a by PN-junction diode, for example.

Also, in the semiconductor layer 202 in the circuit portion 30, a device such as a transistor is formed as necessary.

On the photodetecting portion 20 and the circuit portion 30, the inter-layer insulating film 204 is formed. For the inter-layer insulating film 204, silicon oxide or TEOS (tetraethoxysilane) is used, for example. The inter-layer insulating film 204 is a multilayer film. Between the multilayer films of the inter-layer insulating film 204, the interconnect layer 205 is provided. The photodetecting portion 20 and the circuit portion 30 are connected to each other by the inter-layer interconnect portion 35 of the interconnect layer 205. For the inter-layer interconnect portion 35, aluminum is used, for example. The inter-layer interconnect portion 35 is formed to the position where the through hole 102 is formed, which will be described later.

Also, between the multilayer films of the inter-layer insulating film 204 and above the photodetecting portion 20 and above the support leg 207, which will be described later, an etching stopper film 204a is formed in advance. For the etching stopper film 204a, silicon nitride is used, for example.

Figure 4B:
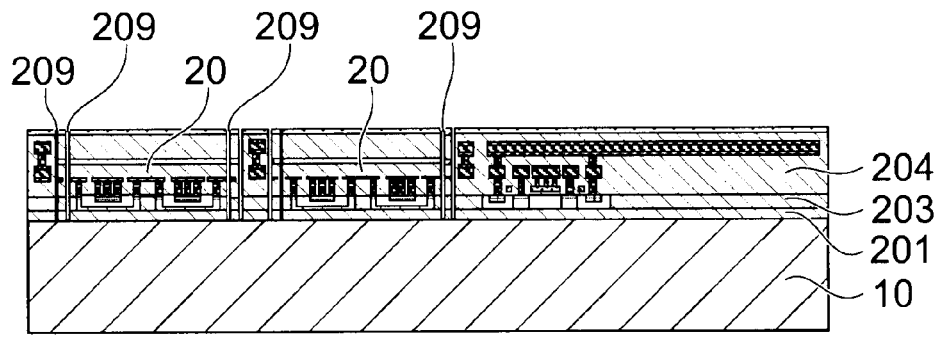

Subsequently, as illustrated in FIG. 4B, the support leg 207 is formed around the photodetecting portion 20. The support leg 207 is formed as follows. That is, the inter-layer insulating film 204, the device isolation insulating film 203, and the embedded oxidized film 201 around the photodetecting portion 20 are subjected to etching so as to form slits 209. On a portion not to be etched, a protective film such as photoresist is formed. The portion left without etching becomes the support leg 207. For the etching, RIE (Reactive Ion Etching) is used, for example.

Figure 4C:
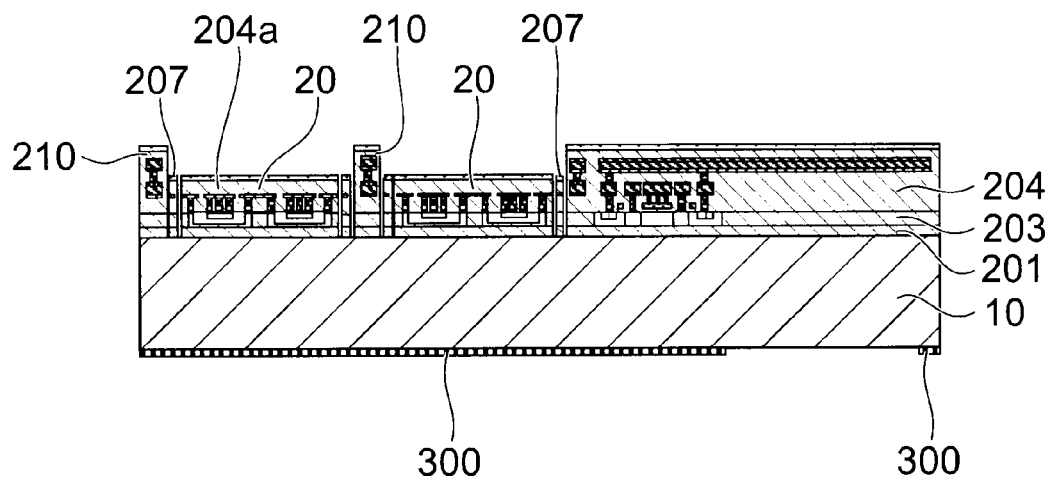

Subsequently, as illustrated in FIG. 4C, a part of the inter-layer insulating film 204 above the photodetecting portion 20 and the support leg 207 is etched and removed. For the etching, dry etching is used, for example. The etching is applied up to a portion above the etching stopper film 204a. As a result, the projecting portion 210 projecting upward from the portion of the photodetecting portion 20 is formed.

Also, a protective mask 300 is formed on the second major surface 10b of the substrate 10 and subjected to patterning. For the protective mask 300, silicon oxide and silicon nitride are used, for example. By means of the patterning of the protective mask 300, an opening is provided at the position where the through hole 102, which will be described later, is formed.

Figure 5A:
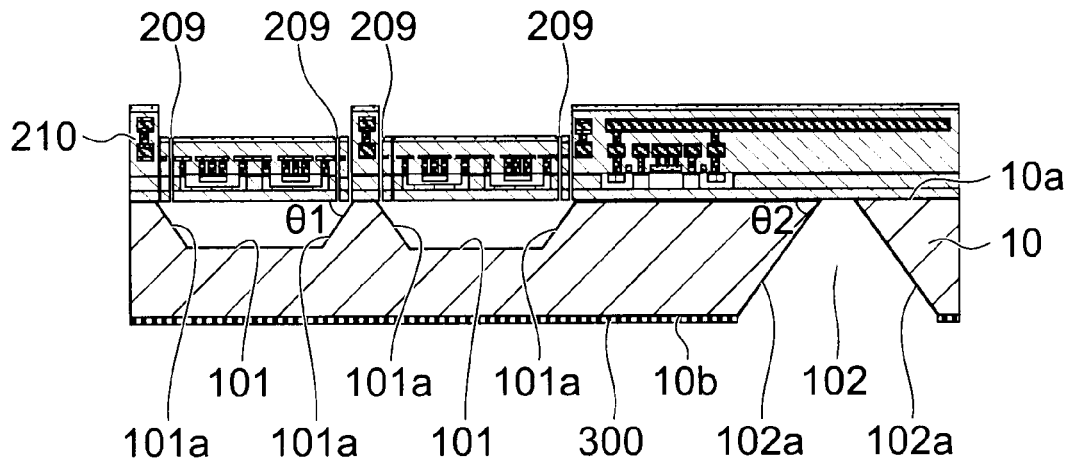

Subsequently, as illustrated in FIG. 5A, the substrate 10 is subjected to etching so as to from the recess portion 101 and the through hole 102.

For the etching, anisotropic etching is applied. For an etchant of the etching, a KOH solution or a TMAH solution is used, for example.

On the first major surface 10a side of the substrate 10, the etchant reaches the first major surface 10a of the substrate 10 through the slits 209 provided when the support leg 207 was formed. If single crystal silicon is used for the substrate 10, for example, the {100} surface is applied to the first major surface 10a. Anisotropic etching has plane direction dependency in an etching speed. Thus, with the progress of etching of the substrate 10, the {111} surface is exposed. By means of the etching, the recess portion 101 is formed, and the {111} surface is exposed in the recess portion 101. The exposed {111} surface becomes the first inclined surface 101a. The first angle θ1 of the first inclined surface 101a to the first major surface 10a is approximately 55°. As a result, the recess portion 101 is formed on the lower side of the photodetecting portion 20, and the photodetecting portion 20 is separated from the substrate 10.

Moreover, the second major surface 10b side of the substrate 10 is also etched by the same etching process using the same etchant.

That is, etching on the second major surface 10b side of the substrate 10 progresses from the opening of the protective mask 300 provided on the second major surface 10b. In this etching, too, the {111} surface is exposed with the progress of etching due to the plane direction dependency of anisotropic etching. The etching of the second major surface 10b is performed till the substrate 10 is penetrated. As a result, the through hole 102 is formed. The {111} surface exposed by etching is the second inclined surface 102a. The second angle θ2 of the second inclined surface 102a to the first major surface 10a is approximately 55°.

In the embodiment, the recess portion 101 and the through hole 102 are formed by the same etching process. By means of anisotropic etching using the same etchant, the first angle θ1 of the first inclined surface 101a of the recess portion 101 and the second angle θ2 of the second inclined surface 102a of the through hole 102 both become approximately 55°. That is, the second inclined surface 102a of the through hole 102 is in parallel with the first inclined surface 101a of the recess portion 101.

Here, if the recess portion 101 and the through hole 102 are formed using the same etching process, since the through hole 102 is deeper than the recess portion 101, the maximum opening size of the through hole 102 becomes larger than the maximum opening size of the recess portion 101.

The etching depth when the substrate 10 is subjected to anisotropic etching pertains to the size of the opening portion with which the etchant is in contact.

Figure 8:
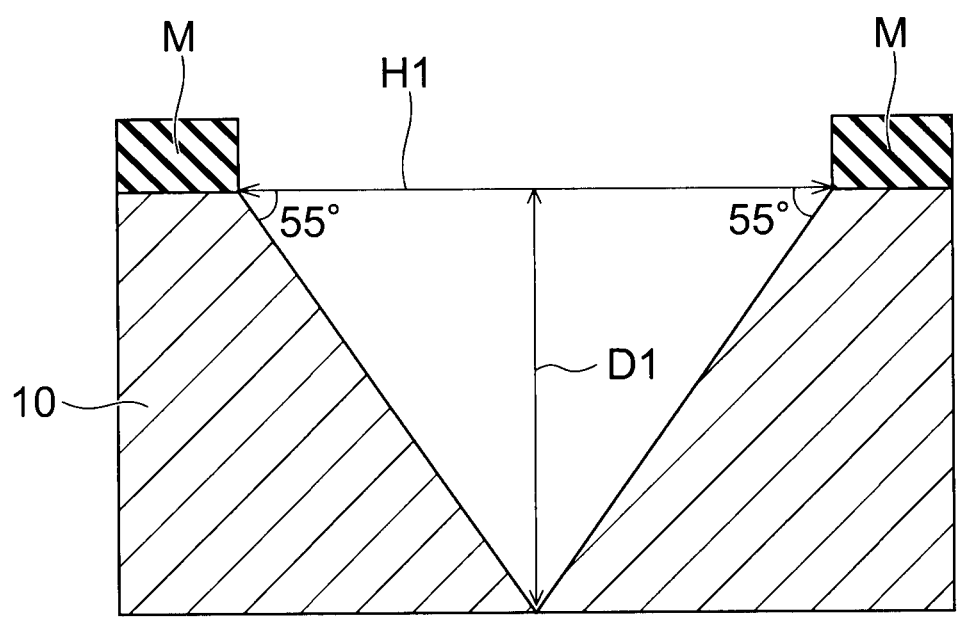
FIG. 8 is a schematic view illustrating the etching depth.

FIG. 8 is a schematic view illustrating the etching depth.

If a mask M is formed on the substrate 10 and the size of the opening of the mask M is H1, etching progresses with a predetermined angle (approximately 55°, fore example) to the first major surface 10a. Therefore, an etching depth D1 of the substrate 10 is determined by the size H1 of the opening portion.

In order to form the through hole 102 penetrating the substrate 10, the size H1 of the opening portion of the mask M (protective mask 300) is determined so that the etching depth D1 is larger than the depth of the substrate 10.

If the size H1 of the opening portion is approximately 1 millimeter (mm), for example, the etching depth D1 becomes approximately 725 micrometer (μm). Also, if the size H1 of the opening portion is approximately 420 μm, the etching depth D1 becomes approximately 300 μm. Also, if the size H1 of the opening portion is approximately 280 μm, the etching depth D1 becomes approximately 200 μm. Also, if the size H1 of the opening portion is approximately 140 μm, the etching depth D1 becomes approximately 100 μm.

As described above, by setting the size H1 of the opening portion in accordance with the desired etching depth D1, the recess portion 101 and the through hole 102 can be etched to a desired depth and formed in the same etching process.

In the embodiment, since the depth of the recess portion 101 is smaller than the thickness of the substrate 10, the size H1 of the opening portion is set so that the etching depth D1 is smaller than the thickness of the substrate 10. Here, in the etching of the recess portion 101, the first inclined surface 101a is exposed with the progress of etching, and the progress of etching is stopped where the distal end of the opposing first inclined surface 101a is crossed.

On the other hand, since the depth of the through hole 102 is larger than the thickness of the substrate 10, the size H1 of the opening portion is set so that the etching depth D1 becomes larger than the thickness of the substrate 10. In formation of the through hole 102, even though the size H1 of the opening portion is set so that the etching depth D1 exceeds the thickness of the substrate 10, etching also stops at the embedded oxidized film 201 on the substrate 10.

In formation of the through hole 102, since etching penetrating the substrate 10 is needed, an area of the opening of the protective mask 300 according to the thickness of the substrate 10 is needed. Therefore, in order to suppress the area of the opening, the substrate 10 may be thinned in advance by CMP (Chemical Mechanical Polishing) or the like to approximately 100 μm, for example.

After the substrate 10 is etched, the protective mask 300 is removed.

Figure 5B:
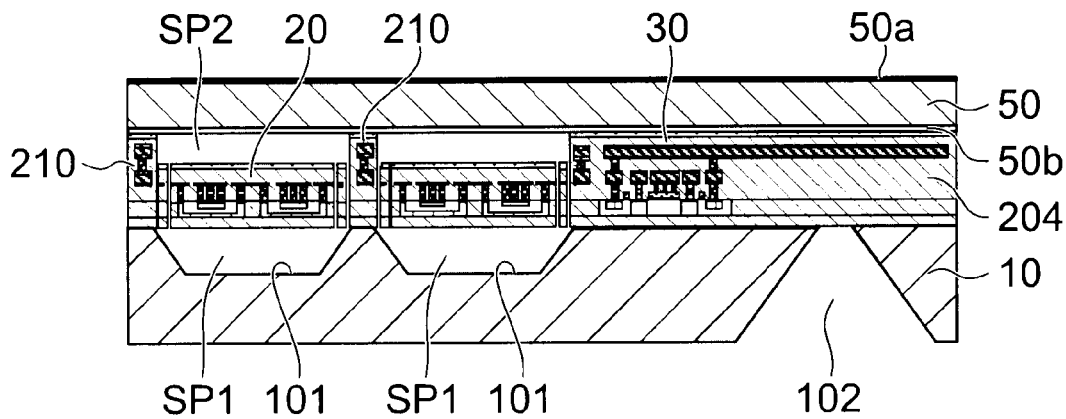

Subsequently, as illustrated in FIG. 5B, the lid 50 is bonded onto the projecting portion 210 and the circuit portion 30. For the bonding of the lid 50, a direct-bonding method by activation of a bonded surface can be used, for example. The lid 50 is bonded to the uppermost layer (a silicon nitride film, for example) of the inter-layer insulating film 204, which is the uppermost layer of the projecting portion 210 and the circuit portion 20.

In the direct-bonding method, an ion of an inactive gas such as Ar (argon) or a light-speed electron beam is radiated to the bonded surface between the uppermost layer of the inter-layer insulating film 204 and the lid 50, and a bond impeding layer is removed. Then, the lid 50 is bonded to the uppermost layer of the inter-layer insulating film 204. As a result, coupling hands of atoms on the surface of the bonded surface are directly coupled with each other, and firm bonding is made possible. The bonding can be made at a normal temperature.

The bonding is performed in a vacuum chamber. As a result, when the lid 50 is bonded, the first space portion SP1 formed on the upper side of the photodetecting portion 20 and the second space portion SP2 formed on the lower side of the photodetecting portion 20 are sealed in the vacuum state.

In this type of direct-bonding method, a gas such as an organic substance generated from solder when being heated is not generated as in the bonding using solder. Therefore, unnecessary substances are not present on the surface of the photodetecting portion 20, and stable vacuum sealing can be performed.

On the front and back faces of the lid 50, AR (Anti Reflective) coats 50a and 50b may be provided. Also, in order to improve bonding performances between the lid 50 and the uppermost layer of the inter-layer insulating film 204, it is preferable that the bonded surface is polished by CMP in advance, for example, in order to improve flatness.

Figure 5C:
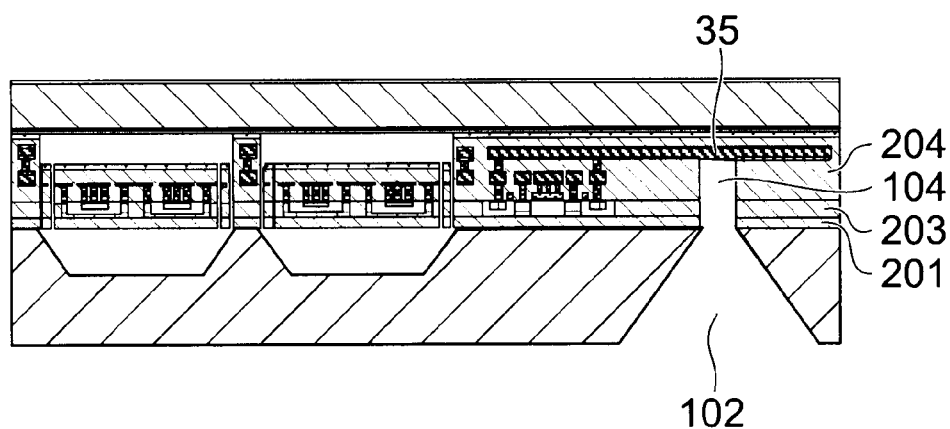

Subsequently, as illustrated in FIG. 5C, the embedded oxidized film 201 exposed by the through hole 102, the device isolation insulating film 203 on it, a barrier metal (not shown) and the inter-layer insulating film 204 are subjected to etching so as to expose the inter-layer interconnect portion 35. For this etching, dry etching is used, for example. By the etching, a communication hole 104 communicating with the through hole 102 is formed.

Figure 6A:
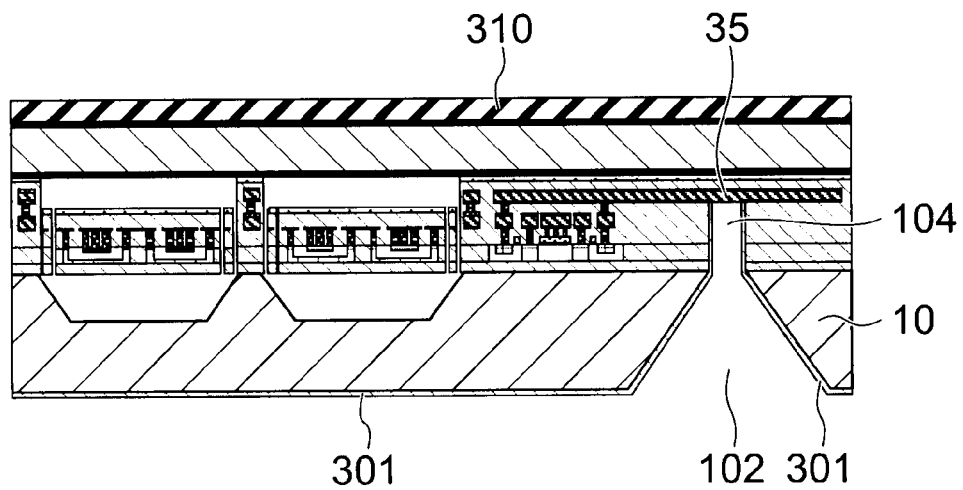

Subsequently, as illustrated in FIG. 6A, an insulating film 301 is formed on the second major surface 10b of the substrate 10, the inner wall of the through hole 102, and the inner wall of the communication hole 104. For the insulating film 301, silicon oxide is used, for example. Then, patterning is performed for the insulating film 301 so as to expose the inter-layer interconnect portion 35 in a portion of the communication hole 104. Also, a protective film 310 is formed on the upper side of the lid 50. For the protective film 310, resist is used, for example.

Figure 6B:
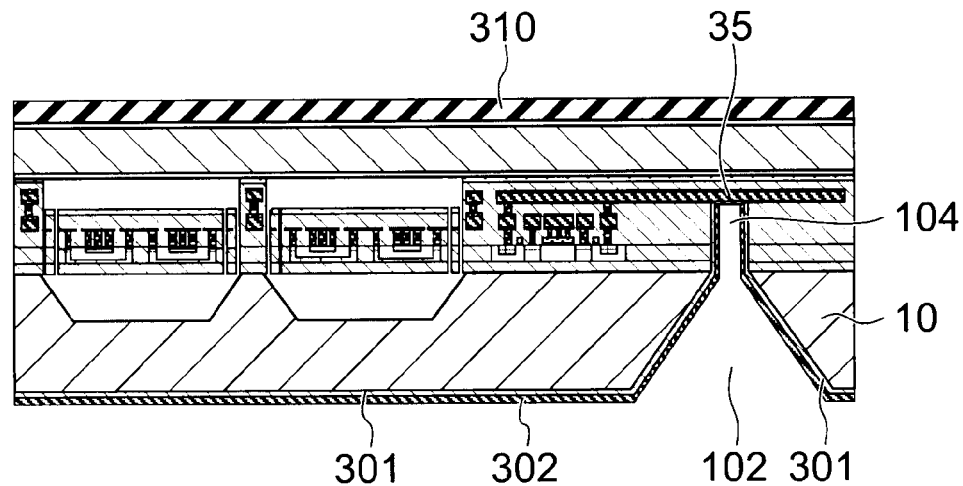

Subsequently, as illustrated in FIG. 6B, a seed layer 302 is formed on the inter-layer interconnect portion 35 exposed in portions of the insulating film 301 and the communication hole 104. For the seed layer 302, copper is used, for example. The seed layer 302 is formed by sputtering, for example. Then, patterning is performed for the seed layer 302 as necessary. The seed layer 302 is in contact with and electrically connected to the inter-layer interconnect portion 35 exposed in the portion of the communication hole 104.

Figure 6C:
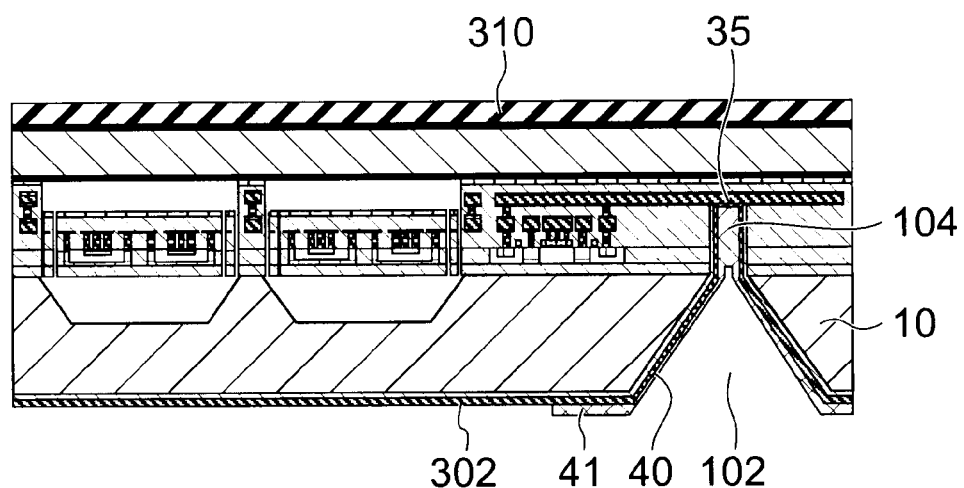

Subsequently, as illustrated in FIG. 6C, the seed layer 302 is plated. For metal of the plating, copper is used, for example. As a result, the through interconnect 40 by metal of the plating is formed at least in the communication hole 104 and in the through hole 102.

In the example illustrated in FIG. 6C, on the back face of the substrate 10, the back-face interconnect 41 of the same plating as the through interconnect 40 is formed.

Figure 7A:
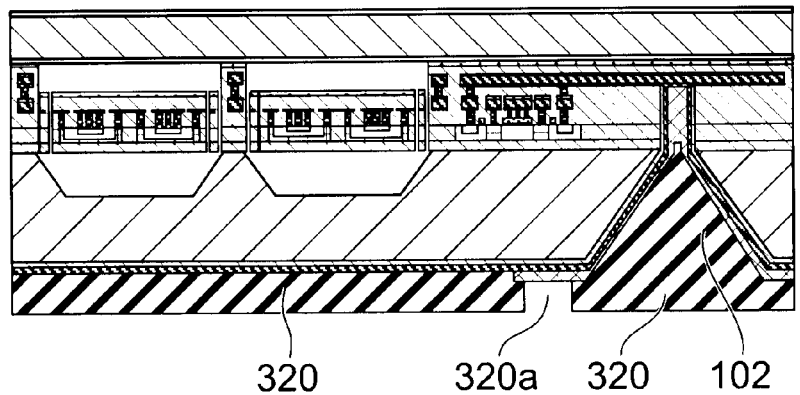

Subsequently, as illustrated in FIG. 7A, solder resist 320 is applied on the back face of the substrate 10. The solder resist 320 is also embedded in the through hole 102. Then, patterning for removing a part of the solder resist 320 is performed. As a result, an opening portion 320a is provided in a part of the solder resist 320. The opening portion 302a is provided in the through interconnect 40 or a portion of the back-face interconnect 41 electrically connected to the through interconnect 40. As a result, the through interconnect 40 or the back-face interconnect 41 is exposed from the opening portion 320a. In the example illustrated in FIG. 7A, the back-face interconnect 41 is exposed from the opening portion 320a.

Figure 7B:
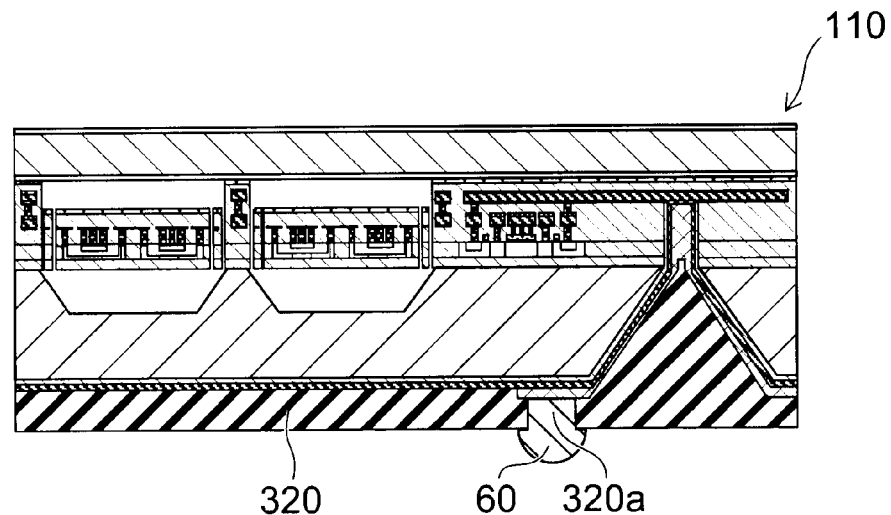

Then, as illustrated in FIG. 7B, in the opening portion 320a of the solder resist 320, the bump electrode 60 is formed. For the bump electrode 60, a solder ball is used, for example. With the above processes, the imaging device 110 is completed. In the imaging device, since the bump electrode 60 is provided on the back face side of the substrate 10, fusion and mounting of the bump electrode 60 on a circuit board, not shown, by reflow and the like is made possible.

Figure 7C:
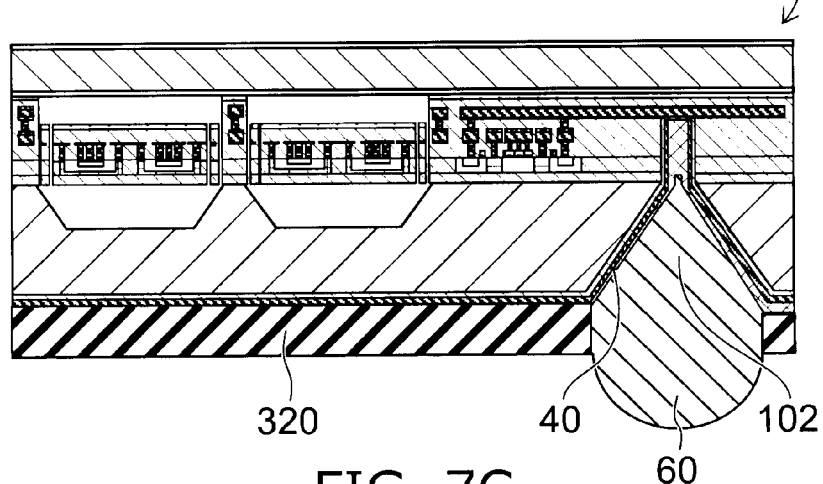

The example of an imaging device 111 illustrated in FIG. 7C is an example in which the back-face interconnect 41 as illustrated in FIG. 7B is not provided and the bump electrode 60 is provided on the through interconnect 40 in the through hole 102. That is, the back-face interconnect 41 is not provided but the opening portion 320a of the solder resist 320 is provided at the position of the through hole 102. As a result, the bump electrode 60 can be formed on the through interconnect 40 in the through hole 102 exposed from the opening portion 320a.

According to the manufacturing method as above, the formation of the photodetecting portion 20 to the formation of the bump electrode 60 can be performed without cutting the substrate 10. Also, the recess portion 101 on the lower side of the photodetecting portion 20 and the through hole 102 of the substrate 10 can be formed by the same etching process, whereby productivity can be improved from the case in which the through hole 102 is formed by a separate process.

Also, the photodetecting portion 20 can be contained in the sealed space by bonding of the lid 50, and size reduction of the device can be achieved as compared with the case of containing and sealing the imaging device 110 in a separate exclusive case.

Also, since the bonding process of the lid 50 is performed at a normal temperature, the imaging device 110 can be manufactured without applying thermal stress to the photodetecting portion 20.

Third Embodiment

A third embodiment is an example of an imaging module.

Figure 9A:
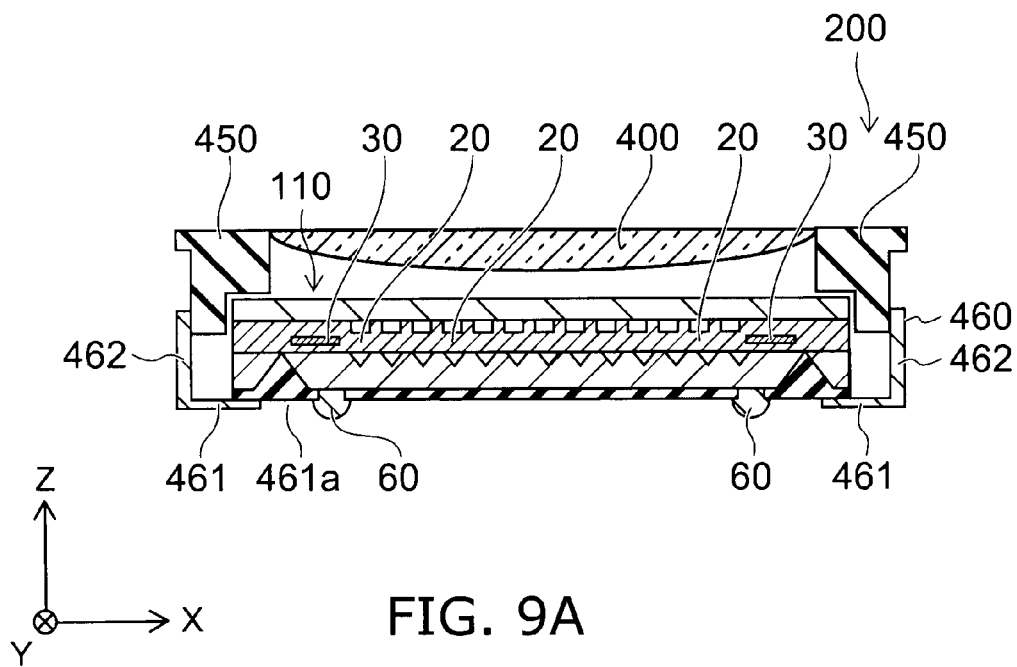
FIGS. 9A and 9B are schematic views illustrating an imaging module of a third embodiment.
Figure 9B:
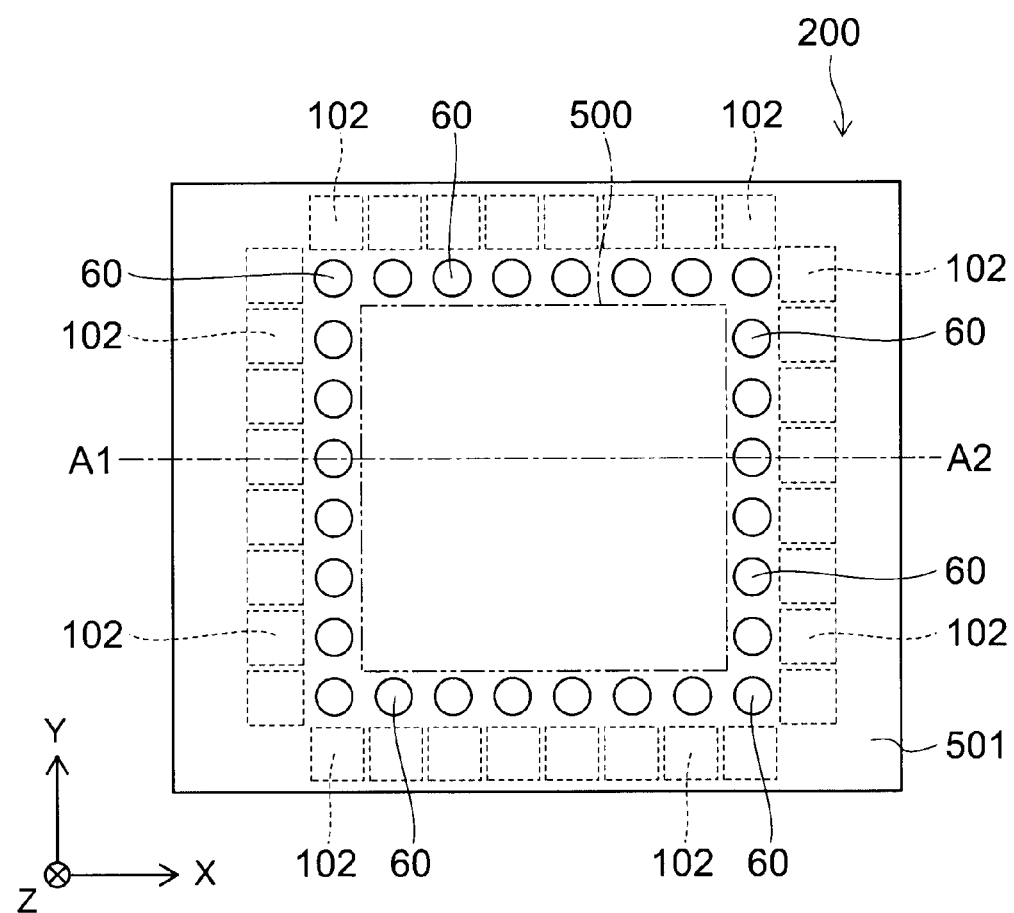

FIGS. 9A and 9B are schematic views illustrating an imaging module according to the third embodiment.

FIG. 9A is a schematic sectional view taken on an A1-A2 line in FIG. 9B, and FIG. 9B is a schematic plan view of a back face of the imaging module.

As illustrated in FIG. 9A, the imaging module 200 according to the third embodiment is provided with the imaging device 110 described above and a lens 400.

The lens 400 is arranged on the lid 50 of the imaging device 110. The lens 400 is mounted on a holder 450, for example. The holder 450 on which the lens 400 is mounted is fixed to the imaging device 110.

For the lens 400, a shape such as a concave lens, a convex lens, a compound lens, an aspherical lens and the like is used according to needs. The holder 450 holds a peripheral edge of the lens 400, for example. The lens 400 and the holder 450 may be separate or may be molded integrally. For example, the lens 400 and the holder 450 may be molded integrally using injection molding or the like.

The imaging module 200 according to the embodiment is provided with an exterior portion 460 that contains the imaging device 110. The exterior portion 460 has a box shape with the upper side opened and is provided with a hole 461a slightly smaller than the outline shape of the substrate 10 substantially at the center of a bottom plate 461. The imaging device 110 is contained while being matched with the hole 461a of the bottom plate 461. From the hole 461a of the bottom plate 461, the bump electrode 60 on the back face of the imaging device 110 is exposed. Between a side plate 462 of the exterior portion 460 and the contained imaging device 110, a part of the holder 450 is fitted. The holder 450 is mounted on the imaging device 110 via the exterior portion 460.

The substrate 10 of the imaging device 110 has an imaging region 500 and a peripheral region 501 juxtaposed to the imaging region 500. The plurality of photodetecting portions 20 are aligned in the imaging region 500. That is, the plurality of photodetecting portions 20 are arranged in a matrix state along the first major surface 10a. The plurality of photodetecting portions 20 may be aligned in a single row along the first major surface 10a. The circuit portions 30 are provided in the periphery of the region in which the plurality of photodetecting portions 20 are arranged.

As illustrated in FIG. 9B, the plurality of through holes 102 are arranged in the peripheral region 501 of the substrate 10. The bump electrodes 60 are provided adjacent to the through holes 102. In the imaging device 110 illustrated in FIGS. 9A and 9B, as illustrated in FIG. 7B, the back-face interconnect 41 is provided on the back-face side of the substrate 10, and the bump electrode 60 is provided on the back-face interconnect 41. Therefore, the bump electrode 60 is arranged at the position adjacent to the through hole 102.

As illustrated in FIG. 7C, if the imaging device 111 in which the bump electrode 60 is provided at the position of the through hole 102 is used, the bump electrode 60 is arranged at the same position as the through hole 102 illustrated in FIG. 9B.

According to the imaging module 200 as above, by means of the imaging device 110 in which the photodetecting portion 20 can be separated from the substrate 10 and the lid without cutting the substrate 10, improvement of productivity and reduction of a manufacturing cost can be achieved.

Also, in the imaging module 200, since the entire imaging device 110 does not have to be sealed air-tightly, the small-sized imaging module 200 can be provided. That is, as compared with the case of containing and vacuum sealing the imaging device 110 in an exclusive case, drastic size reduction can be achieved. For example, in the imaging module 200, a module in a size equal to a chip size obtained by cutting the substrate 10 can be realized.

In the embodiment, the imaging devices 110 and 111 that detect infrared rays are described, but the imaging devices 110 and 111 may detect light in a wavelength region other than the infrared rays. Also, the imaging devices 110 and 111 include a light detection device that detects light. Also, the case in which silicon is used as the substrate 10 is described, but those other than silicon can be also applied.

As described above, according to the embodiment, an imaging device, an imaging module, and a manufacturing method of an imaging device with improved productivity can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An imaging device comprising:
a substrate having a first major surface, a second major surface on a side opposite to the first major surface, a recess portion provided on the first major surface and retreated in a first direction going from the first major surface to the second major surface, and a through hole communicating with the first major surface and the second major surface and extending in the first direction;
a photodetecting portion provided above the recess portion and away from the substrate;
a circuit portion electrically connected to the photodetecting portion and provided on the first major surface; and
a through interconnect electrically connected to the circuit portion and provided inside the through hole,
the recess portion having a first inclined surface inclined to the first major surface, and
the through hole having a second inclined surface in parallel with the first inclined surface.

2. The device according to claim 1, wherein
the second inclined surface includes a surface exposed by anisotropic etching of the substrate.

3. The device according to claim 1, wherein
the substrate contains silicon,
the first major surface is a {100} surface of the silicon, and the second inclined surface includes a {111} surface of the silicon.

4. The device according to claim 3, wherein the second inclined surface includes a surface of an angle of 55° to the first major surface.

5. The device according to claim 1, wherein a maximum opening size of the through hole is larger than a maximum opening size of the recess portion.

6. The device according to claim 1, further comprising:
a lid provided above a side opposite to the substrate of the photodetecting portion and away from the photodetecting portion,
a sealed first space portion being provided between the recess portion of the substrate and the photodetecting portion, and
a sealed second space portion being provided between the lid and the photodetecting portion.

7. The device according to claim 6, wherein a pressure inside the first space portion is lower than the atmospheric pressure, and
a pressure inside the second space portion is lower than the atmospheric pressure.

8. The device according to claim 6, wherein a projecting portion thicker than a thickness of the photodetecting portion along the first direction is provided around the photodetecting portion, and
the lid is provided on the projecting portion.

9. The device according to claim 8, wherein a support leg supporting the photodetecting portion is provided between the photodetecting portion and the projecting portion.

10. The device according to claim 1, wherein a width of the opening of the recess portion in a direction along the first major surface gets smaller from the first major surface toward the second major surface on the side opposite to the first major surface of the substrate, and
a width of the opening of the through hole in a direction along the second major surface gets smaller from the second major surface toward the first major surface.

11. The device according to claim 1, further comprising:
a bump electrode provided on the second major surface, projecting along the first direction, and electrically connected to the through interconnect.

12. The device according to claim 1, wherein the photodetecting portion is provided in a plurality along the first major surface.

13. The device according to claim 10, wherein the photodetecting portion is arranged in a plurality in a matrix state along the first major surface.

14. An imaging module comprising:
an imaging device; and
a lens,
the imaging device including:
a substrate having a first major surface, a second major surface on a side opposite to the first major surface, a recess portion provided on the first major surface and retreated in a first direction going from the first major surface to the second major surface, and a through hole communicating with the first major surface and the second major surface and extending in the first direction;
a photodetecting portion provided above the recess portion and away from the substrate;
a circuit portion electrically connected to the photodetecting portion and provided on the first major surface;
a through interconnect electrically connected to the circuit portion and provided inside the through hole; and
a lid provided above a side opposite to the substrate of the photodetecting portion and away from the photodetecting portion,
the recess portion having a first inclined surface inclined to the first major surface, and
the through hole having a second inclined surface in parallel with the first inclined surface, and
the lens provided on the lid of the imaging device.

15. The module according to claim 14, wherein the photodetecting portion is provided in a plurality along the first major surface.

16. The module according to claim 14, wherein the photodetecting portion is arranged in a plurality in a matrix state along the first major surface.

* * * * *